United States Patent [19]
Utumi et al.

[11] Patent Number: 5,571,603
[45] Date of Patent: Nov. 5, 1996

[54] ALUMINUM NITRIDE FILM SUBSTRATE AND PROCESS FOR PRODUCING SAME

[75] Inventors: Yoshiharu Utumi; Takahiro Imai; Naoji Fujimori, all of Hyogo, Japan

[73] Assignee: Sumitomo Electric Industries, Ltd., Osaka, Japan

[21] Appl. No.: 393,482

[22] Filed: Feb. 24, 1995

[30] Foreign Application Priority Data

Feb. 25, 1994 [JP] Japan ................... 6-028203
Jun. 17, 1994 [JP] Japan ................... 6-135291
Jun. 17, 1994 [JP] Japan ................... 6-135292

[51] Int. Cl.⁶ ............................... C01B 21/072
[52] U.S. Cl. .................. 428/212; 428/408; 428/698; 428/704
[58] Field of Search .................. 310/313 A, 313 R; 428/408, 698, 212, 704

[56] References Cited

U.S. PATENT DOCUMENTS

| | | | |
|---|---|---|---|
| 4,511,816 | 4/1985 | Mikoshiba et al. | 310/313 A |
| 4,571,519 | 2/1986 | Kawabata et al. | 310/313 A |
| 4,868,444 | 9/1989 | Shibata et al. | 310/313 A |
| 4,952,832 | 8/1990 | Imai et al. | 310/313 A |
| 5,235,233 | 8/1993 | Yamamoto | 310/313 A |
| 5,329,208 | 7/1994 | Imai et al. | 310/313 R |
| 5,426,340 | 6/1995 | Higaki et al. | 310/313 R |

FOREIGN PATENT DOCUMENTS

| | | | |
|---|---|---|---|
| 220910 | 1/1990 | Japan | H03H 9/145 |
| 3-175811 | 7/1991 | Japan . | |
| 5-090888 | 4/1993 | Japan . | |

OTHER PUBLICATIONS

S. Kaneko et al., Journ. of Cryst. Growth, vol. 115:163 (1991) 643–647, "Expitaxial growth of AlN film by low-pressure MOCVD in gas–beam–flow reactor".

A. H. Khan et al., SPIE, vol. 2151, Jan. 27, 1994, "AlN on diamond thin films grown by chemical vapor deposition methods".

*Primary Examiner*—Archene Turner
*Attorney, Agent, or Firm*—Sughrue, Mion, Zinn, Macpeak & Seas

[57] ABSTRACT

An aluminum nitride film substrate comprising a single crystal diamond having, on its (111) plane, (1) a C-axis oriented aluminum nitride film or (2) an aluminum nitride single crystal film, the C-plane of the aluminum nitride single crystal being parallel to the (111) plane of said single crystal diamond an aluminum nitride film substrate comprising a substrate having thereon a (111) direction oriented diamond polycrystalline film, and further having thereon a C-axis oriented aluminum nitride film; and process for producing these aluminum nitride film substrate.

4 Claims, 1 Drawing Sheet

5,571,603

ALUMINUM NITRIDE FILM SUBSTRATE AND PROCESS FOR PRODUCING SAME

FIELD OF THE INVENTION

The present invention relates to an aluminum film substrate for use in, e.g., high frequency filter. More particularly, the present invention relates to a process for the preparation of an aluminum nitride film substrate for use in a surface acoustic wave device, etc.

BACKGROUND OF THE INVENTION

Aluminum nitride exhibits a higher surface wave propagation speed than piezoelectric materials such as ZnO and PZT and thus has been noted as a material for a high frequency surface acoustic wave element. For this purpose, a single crystal aluminum nitride is preferably used. However, since a large-sized single crystal aluminum nitride cannot be produced by the techniques that are currently available, it is a common practice to form, on a substrate of a different kind material, a single crystal aluminum nitride film or a polycrystalline aluminum nitride film oriented in a predetermined direction. The orientation of the single crystal aluminum nitride film and that of the polycrystalline aluminum nitride film are normally such that the C-axis of the film is perpendicular to the substrate. As the substrate of a different kind material on which the aluminum nitride film is formed, glass, which is inexpensive, and sapphire, on which a single crystal aluminum nitride can be formed, are generally used.

As a substrate of a different kind material which can propagate wave at a high speed and exhibits a high electromechanical coupling coefficient when aluminum nitride is formed thereon, diamond capable of propagating wave at the highest speed among all substances can be used, as disclosed in JP-A-2-20910 (The term "JP-A" as used herein means an "unexamined published Japanese patent application"). This construction, in which an aluminum nitride film is formed on diamond, concerns a surface acoustic wave device comprising an aluminum nitride film formed on a crystalline diamond film formed on a single crystal semiconductor substrate. The results of analysis of the surface acoustic wave device having a two-layer construction comprising a (100) plane [100] direction crystalline diamond film and a (001) plane aluminum nitride (hereinafter sometimes abbreviated as "AlN") film are disclosed in the drawings in JP-A-2-20910. In this known example, an amorphous silicon dioxide film is formed on the (100) plane of a diamond single crystal film or a diamond polycrystalline film formed on the (100) plane of a single crystal semiconductor substrate. An aluminum nitride film is formed on the silicon dioxide film to obtain an excellent C-axis oriented film.

JP-A-5-890888 proposes a process for producing a C-axis oriented aluminum nitride film on a (100) direction oriented diamond polycrystalline film. It proposes that a seed crystal, from which a (100) direction oriented crystalline diamond film is formed on a silicon substrate, be formed on the silicon substrate.

JP-A-64-42813 proposes a construction in which a single crystal aluminum nitride is formed on a single crystal diamond, which acts as a substrate having an excellent heat resistance and environmental resistance.

In the above cited JP-A-2-20910, the results of analysis of KH dependence of the phase velocity of the surface acoustic wave in the two-layer construction comprising a (100) plane [100] direction crystalline diamond film and a (001) plane AlN film are set forth in FIG. 11. However, this analysis is of an ideal condition, but there is no disclosure of the actual degree of orientation of the (100) plane [100] direction crystalline diamond film and the (001) plane AlN film.

The technique of the above cited JP-A-2-20910 involves a problem in the formation of an aluminum nitride film on an amorphous silicon dioxide film formed on a diamond film. The aluminum nitride film has an insufficient orientation since it is formed on an amorphous film. Further, since silicon dioxide, which propagates wave at a lower speed than diamond and aluminum nitride, is present interposed between the diamond film and the aluminum nitride film, the inherent superiority of the combination of high wave velocity substances, i.e., diamond and aluminum nitride, cannot be sufficiently utilized.

The technique of the above cited JP-A-5-090888 is not clear whether the formation of an aluminum nitride film on a (100) direction oriented diamond polycrystalline film can provide a good C-axis orientation. The above cited JP-A-64-42813 proposes the (111) plane of a single crystal diamond as the crystal surface on which aluminum nitride grows. However, there is no disclosure of the plane direction of aluminum nitride which grows on the (111) plane of the single crystal diamond.

SUMMARY OF THE INVENTION

It is therefore an object of the present invention to provide an aluminum nitride film substrate comprising an aluminum nitride film having an excellent crystallinity and C-axis orientation provided on a single crystal diamond or a diamond polycrystalline film.

It is another object of the present invention to provide a process for producing the aluminum nitride film substrate.

These and other objects of the present invention will become more apparent from the following detailed description and examples.

The present invention relates to, as a first aspect, an aluminum nitride film substrate comprising a single crystal diamond having, on its (111) plane, (1) a C-axis oriented aluminum nitride film or (2) an aluminum nitride single crystal film, the C-plane of the aluminum nitride single crystal being parallel to the (111) plane of the single crystal diamond.

The present invention also relates to, as a second aspect, an aluminum nitride film substrate comprising a substrate having thereon a (111) direction oriented diamond polycrystalline film, and further having thereon a C-axis oriented aluminum nitride film.

The present invention further relates tog as a third aspect, a process for producing the aluminum nitride film substrate according to the above first or second aspect of the present invention, the process comprising the steps of:

leveling the surface of a single crystal diamond or the surface of a (111) direction oriented diamond polycrystalline film by polishing;

subjecting the surface to a hydrogen-terminating treatment; and forming, on the surface thus-treated, the C-axis oriented aluminum nitride film or the aluminum nitride single crystal film.

DETAILED DESCRIPTION OF THE INVENTION

Figure 1:
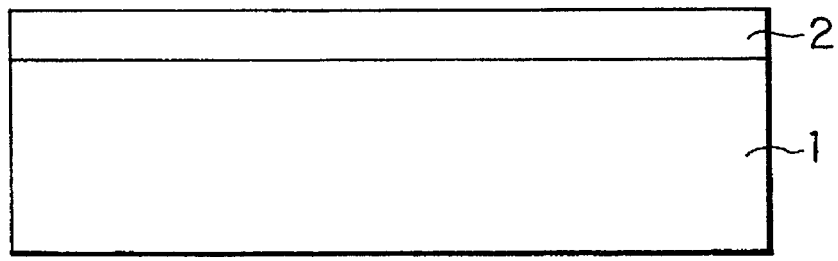
FIG. 1 is a schematic sectional view illustrating an example of the construction of the aluminum nitride film substrate according to the first aspect of the present invention, in which a C-axis oriented aluminum nitride polycrystalline film 2 is formed on the (111) plane of a single crystal diamond 1.
Figure 2:
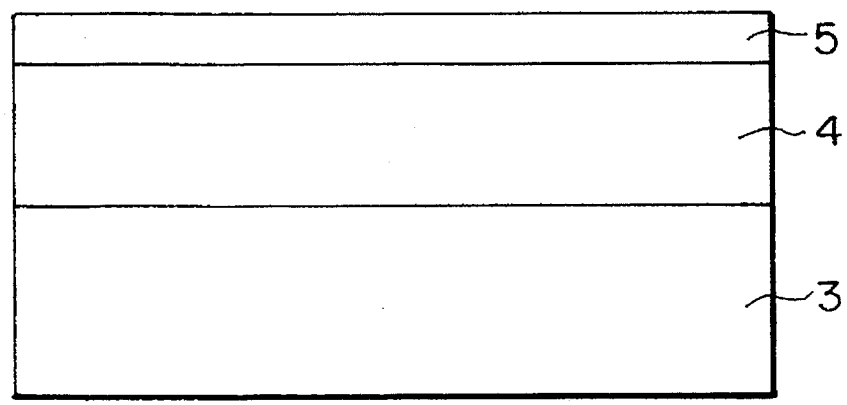
FIG. 2 is a schematic sectional view illustrating an example of the construction of the aluminum nitride film substrate according to the second aspect of the present invention, in which a C-axis oriented aluminum nitride film 5 is formed on a (111) direction oriented diamond polycrystalline film 4 formed on a substrate 3.
Figure 3:
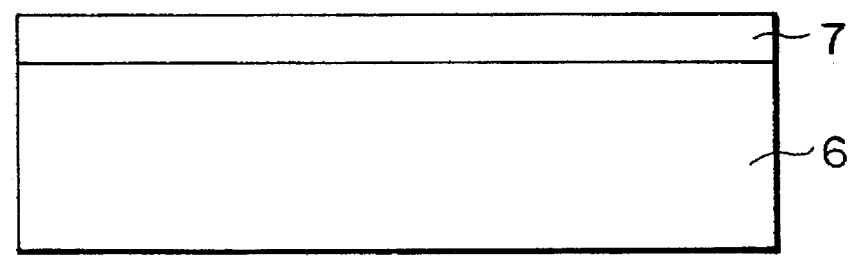
FIG. 3 is a schematic sectional view illustrating an example of the construction of the aluminum nitride film substrate according to the first aspect of the present invention, in which an aluminum nitride single crystal film 7 is formed on the (111) plane of a single crystal diamond 6.

The first aspect of the present invention relates to an aluminum nitride film substrate comprising a C-axis oriented aluminum nitride film formed on the (111) plane of a single crystal diamond, or an aluminum nitride single crystal film formed on the (111) plane of a single crystal diamond, the C-plane of the aluminum nitride being parallel to the (111) plane of the single crystal diamond. The second aspect of the present invention is an aluminum nitride film substrate comprising a C-axis oriented aluminum nitride film formed on a (111) direction oriented diamond polycrystalline film formed on a substrate.

The production process of such an aluminum nitride film substrate is not particularly limited. The aluminum nitride film substrate can be preferably obtained by the third aspect of the present invention, which comprises hydrogen-terminating the surface of a single crystal diamond or a diamond polycrystalline film which has been leveled by polishing, and then forming an aluminum nitride film on the single crystal diamond or diamond polycrystalline film.

The terms "C-axis oriented aluminum nitride film" and the "aluminum nitride single crystal film" are sometimes referred simply to as an "aluminum nitride film".

The aluminum nitride film of the present invention may not always have the stoichiometric composition. In other words, the molar ratio of aluminum and nitrogen may not be 1/1. In particular, the molar ratio of aluminum and nitrogen tends to fluctuate from the stoichiometric composition when the aluminum nitride film is prepared by a gas phase process, such as a sputtering process, a reactive vacuum evaporation process, a molecular beam epitaxy (MBE) process, and a metal organic chemical vapor deposition (MOCVD) process. Such aluminum nitride films are included in the scope of the present invention.

The term "aluminum nitride single crystal film" used herein means an epitaxial film of aluminum nitride in which the crystalline direction of the film is uniformly oriented. Accordingly, when a film has crystalline boundaries due to crystal growth via sea-island structures, such a film is included in the scope of the present invention if all the crystalline directions are uniformly oriented.

The inventors of the present invention have found that an aluminum nitride film having higher crystallinity and higher orientation can be obtained by forming, on a single crystal diamond or a polycrystalline film having (111) plane as a main plane an aluminum nitride film having such an orientation that C-plane of aluminum nitride is parallel to (111) plane of the diamond, i.e., C-axis oriented aluminum nitride film. Further, in order to form on a diamond an aluminum nitride fill excellent in both crystallinity and C-axis orientation, the inventors have found a process which comprises hydrogen-terminating the surface of a diamond, and then forming an aluminum nitride fill thereon to provide an aluminum nitride film having an improved quality.

In general, the higher C-axis orientation a piezoelectric material has, the higher is the piezoelectric properties thereof. Therefore, the inventors of the present invention have studied about the method for enhancing the orientation of an aluminum nitride film. As a result, it has been found that the surface orientation of a diamond substrate exhibits the greatest effect.

In the present invention, an excellent aluminum nitride film excellent in both crystallinity and C-axis orientation can be realized by allowing a hexagonal system aluminum nitride having a hexasymmetric atomic arrangement to grow on the (111) surface of a diamond having a hexasymmetric atomic arrangement in such a manner that the C-plane, i.e., the (001) plane, of the hexagonal system aluminum nitride is parallel to the surface of the diamond. As the (111) surface of a diamond having a hexasymmetric atomic arrangement on which an aluminum nitride film is formed, the (111) plane of a single crystal diamond or a (111) direction oriented polycrystalline diamond can be used.

The (111) plane of a single crystal diamond allows a single crystal aluminum nitride film formed thereon and thus is most desirable but is expensive. Examples of the single crystal diamond include a natural single crystal diamond and a synthetic single crystal diamond obtained by a high pressure process or a vapor phase process.

As the (111) direction oriented polycrystalline diamond, an artificial polycrystalline diamond synthesized by a vapor phase process is preferably used. Such an artificial polycrystalline diamond is inexpensive and has a high quality. Any of the (111) direction oriented polycrystalline diamond may be used so far as the ratio of the height of (111) diffraction line to the height of (220) diffraction line is not less than 5/1 as determined by X-ray diffractometry.

The thickness of the (111) direction oriented diamond polycrystalline film is generally at least 100 nm after leveling by polishing to provide an aluminum nitride film having good C-axis orientation characteristics on the diamond polycrystalline film. When the aluminum nitride film substrate is used for a surface acoustic wave device, the thickness of the (111) direction oriented diamond polycrystalline film is preferably from 1 to 100 μm since good wave transmission characteristics can be obtained in this range owing to the high ultrasonic velocity in diamond.

As the method for forming the (111) direction oriented diamond polycrystalline film, any conventional methods can be employed, such as a hot filament process, a microwave CVD process, a plasma Jet process, etc. The (111) direction oriented diamond polycrystalline film can be obtained by appropriately controlling the conditions under which the film is formed. In the hot filament process, for example, the conditions for obtaining the (111) direction oriented diamond polycrystalline film are generally a substrate temperature of from 800° to 1,200° C., a $CH_4/H_2$ ratio of from 0.3 to 0.6%, and a pressure of from 25 to 50 Torr.

The surface of the single crystal diamond or the polycrystalline diamond is preferably worked mechanically because the roughness of the surface thereof, on which the aluminum nitride film is formed, is preferably small enough to form the aluminum nitride film having an excellent crystallinity and orientation. The surface roughness Ra of the diamond is preferably in the range of 5 nm to 0.1μ. The (111) plane of a single crystal diamond takes a longer time to polish than other planes. A plane inclined at one to three degrees from the (111) plane can be used in the present invention because it takes a shorter time to polish than the (111) plane and crystallinity and orientation of the aluminum nitride film formed on such a plane are not adversely affected.

The surface of the diamond thus worked has oxygen adsorbed and thus mostly shows no structural characteristics of diamond crystals. The surface of the single crystal diamond or the diamond polycrystalline film can be subjected to a hydrogen-terminating treatment to remove adsorbed oxygen therefrom and terminate dangling bonds on the diamond surface by hydrogen atoms. Thus, the structure of the aluminum nitride film formed on the diamond surface can be easily influenced by the atomic arrangement of the diamond surface. Accordingly, an aluminum nitride film having en excellent orientation can be formed.

The hydrogen-terminating method may be a method which comprises the use of hydrogen plasma with the aid of microwave as described in examples described later. Any other known methods can also be used, such as a plasma process and a hot filament process, so far as they can excite hydrogen atoms to produce active hydrogen radicals.

In the aluminum nitride film substrate according to the present invention, the thickness of the aluminum nitride film is generally from 10 nm to 100 μm though it varies depending on the end usage of the substrate. When the aluminum nitride film substrate is used for a surface acoustic wave device, the thickness of the aluminum nitride film is preferably from 100 nm to 10 μm since good wave transmission characteristics can be obtained in this range.

The aluminum nitride film in the aluminum nitride film substrate of the present invention exhibits an excellent crystallinity and a good heat dissipation and thus can be used as a high frequency filter or a surface acoustic wave device having little loss in ultrahigh speed communications. The smaller the value of full width at half maximum (FWHM) on the rocking curve of the aluminum nitride crystal is, the better is the crystallinity of the aluminum nitride crystal. The value of full width at half maximum on the rocking curve of the (002) plane of the C-axis oriented aluminum nitride film is preferably not more than 5°, more preferably not more than 2°. If the aluminum nitride is a single crystal, the half value width on the rocking curve is not more than 2°.

The construction in which a C-axis oriented polycrystalline aluminum nitride film is formed on a (111) direction oriented diamond polycrystalline film formed on a single crystal or polycrystalline silicon can be produced in a low cost. Examples of the substrate include a material having a thermal expansion coefficient near to that of diamond, such as molybdenum and tungsten, as well as single crystal or polycrystalline silicon.

The method for forming the aluminum nitride film the present invention is not particularly limited and maybe any known methods, such as a sputtering process, a reactive vacuum evaporation process, a molecular beam epitaxy (MBE) process, and a metal organic chemical vapor deposition (MOCVD) process.

The aluminum nitride film of the present invention can preferably be produced by a sputtering process in an atmosphere of gas containing nitrogen or ammonia with aluminum or aluminum nitride as a target.

The sputtering can be accomplished by a reactive sputtering process with a film-forming atmospheric gas containing a sputtering gas such as a rare gas (e.g., Ar, He, and Ne) and a reactive gas such as nitrogen and ammonia to realize aluminum nitride having the stoichiometric composition and an excellent crystallinity. The pressure in the sputtering process is preferably from 1 to 10 mTorr. The partial pressure of nitrogen or ammonia is generally from 20 to 100%, preferably from 50 to 100%, of the total pressure.

If the substrate temperature is at room temperature, a C-axis oriented aluminum nitride film can be formed. However, in order to form an aluminum nitride film having an excellent C-axis orientation or an aluminum nitride epitaxial film with its C-plane being parallel to the surface of the substrate, the substrate is preferably heated. The temperature range of-the substrate within Which a C-axis oriented aluminum nitride can be formed is from 25° and 500° C. The higher the substrate temperature is, the better is the C-axis orientation. The temperature range of the substrate within which an aluminum nitride epitaxial film with its C-plane being parallel to the surface of the substrate is lower from 700° and 1,300° C. If the substrate temperature is lower or higher than this range, the resulting aluminum nitride epitaxial film is mixed with crystals in which planes other than the C-plane of aluminum nitride are parallel to the surface of the substrate and thus exhibits a reduced crystallinity.

As the method for producing the aluminum nitride film of the present invention, the conventional metal organic chemical vapor deposition process can also be employed. The metal organic chemical vapor deposition process using an organometallic compound as an aluminum source is preferably used in the present invention.

Examples of the organometallic compound as an aluminum source include trimethylaluminum (TMA) and triethylaluminum (TEA). The organic metal is generally introduced into a reaction chamber through a bubbler using hydrogen gas. Examples of the nitrogen source include $N_2$ gas and $NH_3$ gas. Because the nitrogen source gas is very difficult to be decomposed in comparison to the organometallic compound as an aluminum source, the molar ratio of the nitrogen source gas to the organometallic compound should be extremely high to prepare an aluminum nitride film having the stoichiometric composition. The molar ratio of the nitrogen source gas to the organometallic compound is generally from $1\times10^3$ to $5\times10^4$. Hydrogen gas is generally used as a carrier gas.

In order to prepare an aluminum nitride film having good crystal properties and a surface of good flatness, the crystal growth is preferably effected under a reduced pressure of from 0.5 to 76 Torr. The temperature of the substrate on crystal growth is generally from 400° to 1,300° C., within which a C-axis oriented aluminum nitride film can be grown on the (111) plane of single crystal diamond or on the (111) direction oriented diamond polycrystalline film. Within this range of substrate temperature, a higher substrate temperature can provide an aluminum nitride film of better C-axis orientation. In the substrate temperature of from 550° to 1,300° C., an aluminum nitride single crystal film can be epitaxially grown on the (111) plane of a single crystal diamond, the C-plane of the film being parallel to the (111) plane of the single crystal diamond, resulting in superior C-axis orientation.

As the process for producing the aluminum nitride film of the present invention, the conventional molecular beam epitaxy process can also be preferably employed.

The aluminum source for the molecular beam epitaxy process can be supplied with an electron beam evaporation source or with a K cell. The nitrogen source, such as $N_2$ or NH$_3$, can be supplied with an ECR ion source or an RF ion source. The temperature of the substrate on crystal growth is generally from 25° to 1,300° C., within which a C-axis oriented aluminum nitride film can be grown. Within this range of substrate temperature, a higher substrate temperature can provide an aluminum nitride film of better C-axis orientation. In the substrate temperature of 500° C. or higher, an aluminum nitride single crystal film can be epitaxially grown on the (111) plane of a single crystal diamond, the C-plane of the film being parallel to the (111) plane of the single crystal diamond, resulting in superior C-axis orientation.

An electrode called a comb-shaped electrode or an interdigital transducer (IDT) electrode can be formed on the aluminum nitride film substrate to provide a high frequency device. Such an electrode can be formed, e.g., by etching. The electrode material is preferably a material having a low resistivity. For example, a metal which can be vacuum-evaporated at a low temperature, such as Au, Ag and Al, can be used. Al is the most preferred for the formation of the electrode.

The present invention will be further described in the following examples and comparative examples, but the present invention should not be construed as being limited thereto.

EXAMPLE 1

A synthetic artificial single crystal diamond, the (111) plane of which had been leveled by polishing, was used as a substrate. The (111) plane of the substrate was washed with an organic solvent and then with a 10% aqueous solution of hydrogen chloride, and then subjected to a hydrogen-terminating treatment. For the surface hydrogen termination treatment, a microwave plasma CVD apparatus was used with hydrogen gas alone being supplied into the apparatus. The treatment was conducted under a pressure of 100 Torr at a microwave power of 400 W for 10 minutes. Under the foregoing conditions, the substrate temperature was 900° C.

An aluminum nitride film was then allowed to grow on the (111) plane of the single crystal diamond thus treated. An RF magnetron sputtering apparatus provided with an aluminum target was used as a film-forming apparatus. The single crystal diamond as a substrate was fixed to a substrate holder in the film-forming chamber. The atmosphere of a chamber was evacuated to $2 \times 10^{-6}$ Torr or less. Ar gas was then supplied into the chamber in such a manner that the pressure therein reached 5 mTorr. An RF power of 800 W was applied to the target to conduct pre-sputtering of the target for 10 minutes.

The atmosphere of the chamber was again evacuated. Ar gas and N$_2$ gas were then supplied into the film-forming chamber in such a manner that their partial pressures reached 2.5 mTorr, respectively. Under these conditions, the target was then pre-sputtered at an RF power of 400 W for 5 minutes. A shutter disposed between the target and the substrate was then opened, and reactive sputtering was effected to form an aluminum nitride film on the substrate. During this film-forming process, the substrate was heated by a heater provided in the substrate holder to a temperature of 700° C.

As a result of the evaluation by RHEED, it was found that the aluminum nitride film thus prepared was a single crystal film with its C-plane having epitaxially grown parallel to the (111) plane of the single crystal diamond. The aluminum nitride film was then evaluated for crystallinity by Raman spectroscopy. As a result, a peak was observed at the peak position corresponding to aluminum nitride, proving that the aluminum nitride film has an excellent crystallinity. The aluminum nitride film was evaluated for C-axis orientation by the measurement of the rocking curve of X-ray diffraction. As a result, it was found that C-axis orientation of the aluminum nitride film was as good as 0.8 degrees in terms of full width at half maximum on the rocking curve of the (002) plane of aluminum nitride.

EXAMPLE 2

The (111) plane of a single crystal diamond was leveled by polishing in the same manner as in Example 1 to prepare a substrate. The substrate was washed and subjected to the surface hydrogen termination treatment in the same manner as in Example 1. An aluminum nitride film was then formed on the substrate in the same manner as in Example 1 except that the substrate temperature was 400° C.

The aluminum nitride film thus prepared was then confirmed by X-ray diffractometry and RHEED to be a polycrystalline film C-axis of which is oriented perpendicular to the (111) plane of the single crystal diamond. The aluminum nitride film was evaluated for C-axis orientation by the measurement of the rocking curve of X-ray diffraction. As a result, it was found that C-axis orientation of the aluminum nitride film was as good as 2.1 degrees in terms of full width at half maximum on the rocking curve of the (002) plane of aluminum nitride.

EXAMPLE 3

A single crystal silicon was used as a substrate. The (100) plane of the substrate was degreased with an organic solvent, and then treated with an aqueous solution of hydrogen fluoride to remove an oxide film naturally formed on the surface. A diamond film was then formed on the substrate by hot filament process under the conditions, on which the distance between the filament and the substrate was 8 mm, the filament temperature was 2,200° C., the substrate temperature was 1,000° C., a mixture of CH$_4$ and H$_2$ (CH$_4$/H$_2$= 0.5%) was used, and the film growth was effected under a pressure of 30 Torr over 30 hours. Thus, a 30-μm thick film was obtained. The diamond film thus prepared was evaluated by X-ray diffractometry, and as a result, it was found that the diamond film was a polycrystalline film mainly composed of (111) direction oriented components. The ratio of height of the (111) diffraction line to that of the (220) diffraction line was 8/1. The diamond film thus prepared showed a relatively large surface unevenness. Thus, the diamond film was then mechanically polished to a surface roughness of not more than 0.1 μm.

The polished surface of the diamond film was then washed and terminated by hydrogen in the same manner as in Example 1. An aluminum nitride film was then produced on the hydrogen-terminated surface of the diamond film under the same film-forming conditions as in Example 2.

The aluminum nitride film thus prepared was then confirmed by X-ray diffractometry and RHEED to be a polycrystalline film C-axis of which is oriented perpendicular to the surface of the diamond polycrystalline film. The aluminum nitride film was evaluated for C-axis orientation by the measurement of the rocking curve of X-ray diffraction. As a result, it was found that C-axis orientation of the aluminum nitride film was as good as 2.6 degrees in terms of full width at half maximum on the rocking curve of the (002) plane of aluminum nitride.

EXAMPLE 4

A diamond polycrystalline film mainly composed of the (111) direction oriented components which had grown on the surface of a polycrystalline silicon was prepared in the same manner as in Example 3. The ratio of height of the (111) diffraction line to that of the (220) diffraction line in the diamond polycrystalline film was 8/1. The substrate was mechanically polished in the same manner as in Example 3, washed with an organic solvent, and then washed with a 10% aqueous solution of hydrogen chloride, whereas the substrate was not subjected to surface hydrogen termination treatment. An aluminum nitride was then produced on the substrate under the same film-forming conditions as in Example 3.

The aluminum nitride film thus prepared was then confirmed by X-ray diffractometry and RHEED to be a polycrystalline film C-axis of which is oriented perpendicular to the surface of the diamond polycrystalline film. The aluminum nitride film was evaluated for C-axis orientation by the measurement of the rocking curve of X-ray diffraction. As a result, it was found that C-axis orientation of the aluminum nitride film was as good as 2.9 degrees in terms of full width at half maximum on the rocking curve of the (002) plane of aluminum nitride.

COMPARATIVE EXAMPLE 1

A single crystal silicon was used as a substrate. The (100) plane of the substrate was then washed in the same manner as in Example 3. A diamond film was then formed on the substrate by hot filament process under the conditions, in which the distance between the filament and the substrate was 8 mm, the filament temperature was 2,200° C., the substrate temperature was 900° C., a mixture of $CH_4$ and $H_2$ ($CH_4/H_2=3\%$) was used, and the film growth was effected under a pressure of 70 Torr over 12 hours. Thus, a 30-µm thick film was obtained. The diamond film thus prepared was evaluated by X-ray diffractometry, and as a result, it was found that the diamond film was a polycrystalline film mainly composed of (110) direction oriented components. The diamond film was then mechanically polished in the same manner as in Example 3. The diamond film was washed with an organic solvent and then with a 10% aqueous solution of hydrogen chloride, whereas the diamond film was not subjected to surface hydrogen termination treatment. An aluminum nitride film was then produced on the diamond film under the same film-forming conditions as in Example 2.

The aluminum nitride film thus prepared was then confirmed by X-ray diffractometry to have a tendency that the C-axis oriented perpendicular to the surface of the diamond polycrystalline film but have diffraction lanes also from the (100) plane, unlike the foregoing examples. The aluminum nitride film was evaluated for C-axis orientation by the measurement of the rocking curve of x-ray diffraction. As a result, it was found that the full width at half maximum on the rocking curve of the (002) plane of aluminum nitride is 15.0 degrees, which indicates a very poor C-axis orientation.

COMPARATIVE EXAMPLE 2

A single crystal silicon was used as a substrate. The (100) plane of the substrate was then washed in the same manner as in Example 3. A diamond film was then formed on the substrate by hot filament process under the conditions, in which the distance between the filament and the substrate was 8 mm, the filament temperature was 2,200° C., the substrate temperature was 900° C., a mixture of $CH_4$ and $H_2$ ($CH_4/H_2=3\%$) was used, and the film growth was effected under a pressure of 70 Torr over 12 hours. Thus, a 30-µm thick film was obtained. The diamond film thus prepared was evaluated by X-ray diffractometry, and as a result, it was found that the diamond film is a polycrystalline film mainly composed of (110) direction oriented components. The diamond film was mechanically polished and washed in the same manner as in Example 3. The diamond film was then subjected to surface hydrogen termination treatment in the same manner as in Example 2. An aluminum nitride film was then produced on the diamond film under the same film-forming conditions as in Example 2.

The aluminum nitride film thus prepared was then confirmed by X-ray diffractometry to have a tendency that the C-axis oriented perpendicular to the surface of the diamond polycrystalline film. The aluminum nitride film was evaluated for C-axis orientation by the measurement of the rocking curve of X-ray diffraction. As a result, it was found that the half value width on the rocking curve of the (002) plane of aluminum nitride is 13.5 degrees, which indicates a poor C-axis orientation.

EXAMPLE 5

The (111) plane of a single crystal diamond was leveled by polishing in the same manner as in Example 1 to prepare a substrate. The substrate was then washed and subjected to the surface hydrogen termination treatment in the same manner as in Example 1. An aluminum nitride film was then formed on the substrate in the same manner as in Example 1 except that the substrate temperature was 1,500° C.

The aluminum nitride film thus prepared was then confirmed by X-ray diffractometry and RHEED to be a single crystal film with its C-plane having epitaxially grown parallel to the (111) plane of the single crystal diamond. The aluminum nitride film was evaluated for C-axis orientation by the measurement of the rocking curve of X-ray diffraction. As a result, it was found that C-axis orientation of the aluminum nitride film was as good as 0.5 degrees in terms of full width at half maximum on the rocking curve of the (002) plane of aluminum nitride.

COMPARATIVE EXAMPLE 3

The (100) plane of an artificial synthetic single crystal diamond as a substrate was leveled by polishing. The substrate was then washed and subjected to surface hydrogen termination treatment in the same manner as in Example 1. An aluminum nitride film was then formed on the substrate in the same manner as in Example 1.

The aluminum nitride film thus formed was then evaluated by RHEED. As a result, it was found that the aluminum nitride film thus prepared has C-plane oriented parallel to the (100) plane of the single crystal diamond. It was also found that two orientations, i.e., aluminum nitride [11–20] diamond [110] and aluminum nitride [10—10] diamond [110] had been established in the C-plane, proving that the aluminum nitride film was a product of epitaxial growth. The aluminum nitride film was then evaluated for crystallinity by Raman spectroscopy. As a result, it was found that there are observed no peaks in the peak position on the aluminum nitride film, proving that the aluminum nitride film has a poorer crystallinity than (111) plane of the single crystal diamond of Example 1. The aluminum nitride film was then evaluated for C-axis orientation by the measurement of the rocking curve of X-ray diffraction. As a result, it was found that C-axis orientation of the aluminum nitride film was as poor as 5.2 degrees in terms of full width at half-maximum on the rocking curve of the (002) plane of aluminum nitride.

COMPARATIVE EXAMPLE 4

The (100) plane of an artificial synthetic single crystal diamond as a substrate was leveled by polishing. The substrate was then washed and subjected to surface hydrogen termination treatment in the same manner as in Example 1. An aluminum nitride film was then formed on the substrate in the same manner as in Example 2.

The aluminum nitride film thus formed was then confirmed by X-ray diffractometry and RHEED to be a polycrystalline film C-axis of which is oriented perpendicular to the (100) plane of the single crystal diamond. The aluminum nitride film was evaluated for C-axis orientation by the measurement of the rocking curve of X-ray diffraction. As a result, it was found that C-axis orientation of the aluminum nitride film is as poor as 6.0 degrees in terms of full width at half maximum on the rocking curve of the (002) plane of aluminum nitride.

COMPARATIVE EXAMPLE 5

A single crystal silicon was used as a substrate. The (100) plane of the substrate was degreased with an organic solvent, and then treated with an aqueous solution of hydrogen fluoride to remove an oxide film naturally formed on the surface. A diamond film was then formed on the substrate by hot filament process under the following conditions, in which the distance between the filament and the substrate was 8 mm, the filament temperature was 2,200° C., the substrate temperature was 750° C., a mixture of $CH_4$ and $H_2$ ($CH_4/H_2=2\%$) was used, and the film growth was effected under a pressure of 40 Torr over 12 hours. Thus, a 30-μm thick film was obtained. The diamond film thus prepared was evaluated by X-ray diffractometry, and as a result, it was found that the diamond film is a polycrystalline film mainly composed of (100) direction oriented components. The diamond film was then mechanically polished to a surface roughness of not more than 0.1 μm in the same manner as in Example 3. The polished surface of the diamond film was then terminated by hydrogen in the same manner as in Example 1. An aluminum nitride film was then produced on the hydrogen-terminated surface of the diamond film under the same conditions as that of Example 2.

The aluminum nitride film thus prepared was then confirmed by X-ray diffractometry and RHEED to be a polycrystalline film C-axis of which is oriented perpendicular to the (100) plane of the single crystal diamond. The aluminum nitride film was evaluated for C-axis orientation by the measurement of the rocking curve of X-ray diffraction. As a result, it was found that full width at half maximum on the rocking curve of the (002) plane of aluminum nitride is 7.5 degrees, which proves that C-axis orientation of the aluminum nitride film is not good.

The results of the foregoing Examples and Comparative Examples are set forth in Table 1.

TABLE 1

| | Substrate and surface treatment | | | | Aluminum nitride film | | |
|---|---|---|---|---|---|---|---|
| | Substrate | Diamond film | Surface hydrogen termination | Substrate temperature (°C.) | Film type | Full width at half maximum of rocking curve (degree) | C-axis orientation |
| Example 1 | single crystal diamond (111) plane | — | yes | 700 | epitaxial single crystal film | 0.8 | excellent |
| Example 2 | single crystal diamond (111) plane | — | yes | 400 | C-axis oriented film | 2.1 | good |
| Example 3 | single crystal silicon (100) plane | (111)-oriented poly-crystalline film | yes | 400 | C-axis oriented film | 2.6 | good |
| Example 4 | poly-crystalline silicon | (111)-oriented poly-crystalline film | none | 400 | C-axis oriented film | 2.9 | good |
| Example 5 | single crystal diamond (111) plane | — | yes | 1,150 | epitaxial single crystal film | 0.5 | excellent |
| Comparative Example 1 | single crystal silicon (100) plane | (110)-oriented poly-crystalline film | none | 400 | poly-crystalline film | 15.0 | poor |
| Comparative Example 2 | single crystal silicon (100) plane | (110)-oriented poly-crystalline film | yes | 400 | poly-crystalline film | 13.5 | poor |
| Comparative Example 3 | single crystal diamond (100) plane | — | yes | 700 | poly-crystalline film | 5.2 | poor |
| Comparative Example 4 | single crystal | — | yes | 400 | poly-crystalline | 6.0 | poor |

TABLE 1-continued

| | Substrate and surface treatment | | | | Aluminum nitride film | | |
| --- | --- | --- | --- | --- | --- | --- | --- |
| | Substrate | Diamond film | Surface hydrogen termination | Substrate temperature (°C.) | Film type | Full width at half maximum of rocking curve (degree) | C-axis orientation |
| Comparative Example 5 | diamond (100) plane single crystal silicon (100) plane | (100)-oriented poly-crystalline film | yes | 400 | film poly-crystalline film | 7.5 | poor |

EXAMPLE 6

A (111) plane of a single crystal diamond as a substrate was leveled by polishing in the same manner as in Example 1. The substrate was washed and subjected to a surface hydrogen termination treatment in the same manner as in Example 1.

An aluminum nitride film was then grown on the (111) plane of the substrate by a metal organic chemical vapor deposition process. The substrate was placed on a graphite susceptor in a reaction chamber. Trimethylaluminum (TMA) was introduced into the reaction chamber at a bubbling $H_2$ flow rate of 10 ccm, and the conditions were regulated to an $NH_3$ flow rate of 3 l/min, a carrier $H_2$ flow rate of 100 ccm, an $NH_3$/TMA molar ratio of $2 \times 10^4$, and a pressure in the reaction chamber of 5 Torr. The susceptor was heated by radiofrequency heating, so that the temperature of the growing surface of the substrate was 1,200° C. An aluminum nitride film was grown for 1 hour to obtain a film having a thickness of 2 μm.

As a result of the evaluation by RHEED, it was found that the aluminum nitride film thus prepared was a single crystal film, the C-plane of which epitaxially grew parallel to the (111) plane of the single crystal diamond. The aluminum nitride film was evaluated for C-axis orientation by the measurement of the rocking curve of X-ray diffraction. As a result, it was found that C-axis orientation of the aluminum nitride film was as good as 0.2 degree in terms of full width at half maximum of the (002) plane of aluminum nitride.

EXAMPLE 7

A (111) plane of a single crystal diamond as a substrate was leveled by polishing in the same manner as in Example 1. The substrate was washed and subjected to a surface hydrogen termination treatment in the same manner as in Example 1.

An aluminum nitride film was then grown on the (111) plane of the substrate by a molecular beam epitaxy process. The substrate was placed on a substrate holder in a chamber. The chamber was evacuated to $1 \times 10^{-9}$ Torr or less, and then formation of an aluminum nitride film was carried out. As a nitrogen source, an ECR ion source was used and $N_2$ gas was supplied, to which a microwave power of 450 W was applied. Ions generated in the ECR ion source were accelerated towered the surface of the substrate by an acceleration voltage of 200 V. As an aluminum source, Al was evaporated by an electron beam evaporation and supplied to the surface of the substrate at a film forming rate of 0.025 nm/s. During the film formation, the temperature of the substrate was 1,100° C. The film formation was carried out for 2 hours and an aluminum nitride film having a thickness of about 0.16 μm was obtained.

As a result of the evaluation by RHEED, it was found that the aluminum nitride film thus prepared was a single crystal film, the C-plane of which epitaxially grew parallel to the (111) plane of the single crystal diamond. The aluminum nitride film was evaluated for C-axis orientation by the measurement of the rocking curve of X-ray diffraction. As a result, it was found that C-axis orientation of the aluminum nitride film was as good as 0.25 degree in terms of full width at half maximum of the (002) plane of aluminum nitride.

It is understood from the results of the above Examples and Comparative Examples that the comparison of the aluminum nitride films in C-axis orientation by full width at half maximum on the rocking curve shows that the aluminum nitride film formed on the single crystal diamond or polycrystalline film having the (111) plane as a main plane has a good C-axis orientation, whereas the aluminum nitride film formed on the single crystal diamond or polycrystalline film having other planes as main planes cannot have a good C-axis orientation. Further, the diamond substrate, the surface of which has been terminated by hydrogen, provides a better C-axis orientation than the diamond substrate, which has not been subjected to hydrogen termination treatment.

As mentioned above, the formation of an aluminum nitride film on a single crystal diamond or the polycrystalline film having the (111) plane as a main plane provides a good C-axis orientation. Further, the surface hydrogen termination of a single crystal diamond or a polycrystalline film makes it possible to provide an aluminum nitride film having a better C-axis orientation than the absence of surface hydrogen termination.

While the invention has been described in detail and with reference to specific embodiments thereof, it will be apparent to one skilled in the art that various changes and modifications can be made therein without departing from the spirit and scope thereof.

What is claimed is:

1. An aluminum nitride film substrate comprising a single crystal diamond having, on its (111) plane, (1) a C-axis oriented aluminum nitride film or (2) an aluminum nitride single crystal film, the C-plane of said aluminum nitride single crystal being parallel to the (111) plane of said single crystal diamond.

2. An aluminum nitride film substrate comprising a substrate having thereon a (111)-direction oriented diamond polycrystalline film, and further having thereon a C-axis oriented aluminum nitride film.

3. The aluminum nitride film substrate of claim 1, wherein the diamond has on its (111) plane a C-axis oriented aluminum nitride film.

4. The aluminum nitride film substrate of claim 1, wherein the diamond has on its (111) plane an aluminum nitride single crystal film.

* * * * *